United States Patent
Lei et al.

[11] Patent Number: 6,100,107
[45] Date of Patent: Aug. 8, 2000

[54] MICROCHANNEL-ELEMENT ASSEMBLY AND PREPARATION METHOD THEREOF

[75] Inventors: Kuo-Lung Lei; Ten-Hsing Jaw; Chen-Kuei Chung; Dong-Sing Wuu; Ching-Yi Wu, all of Hsinchu, Taiwan

[73] Assignee: Industrial Technology Research Institute, Hsinchu, Taiwan

[21] Appl. No.: 09/137,447

[22] Filed: Aug. 6, 1998

[51] Int. Cl.[7] .................................................. H01L 21/302
[52] U.S. Cl. ............................. 438/50; 438/456; 438/745
[58] Field of Search ................................ 438/50, 52, 53, 438/456, 745; 216/2; 73/514.16, 717, 754

[56] References Cited

U.S. PATENT DOCUMENTS

| | | | |
|---|---|---|---|
| 4,706,061 | 11/1987 | Johnson | 338/34 |
| 5,285,131 | 2/1994 | Muller et al. | 313/578 |
| 5,620,929 | 4/1997 | Hosoi et al. | 438/50 |
| 5,844,287 | 12/1998 | Hassan et al. | 438/53 |
| 5,855,801 | 1/1999 | Lin et al. | 438/745 |
| 5,956,003 | 9/1999 | Fisher | 345/73 |

*Primary Examiner*—Mary Wilczewski
*Assistant Examiner*—Yung A. Lin
*Attorney, Agent, or Firm*—Bacon & Thomas

[57] ABSTRACT

A preparation method for an integrated assembly of a microchannel and an element is disclosed. In the preparation method of this invention, an element is prepared between a substrate and a sacrificial layer. Two protection layers, which are resistant to etchant for said substrate and said sacrificial layer, are prepared to isolate said element from its ambient environment. Said sacrificial layer defines an area to be etched off such that a microchannel may be formed. A coating layer with etching windows is then prepared on said sacrificial layer and the assembly is etched in an etchant to etch off said sacrificial layer and an area of said substrate beneath said sacrificial layer. An integrated assembly of a closed microchannel and an element is then accomplished. In the invented method, no bonding process is necessary and the integrated assembly so prepared has a planarization surface. This invention also disclosed a microchannel-element assembly prepared under the method of this invention.

5 Claims, 2 Drawing Sheets

(101)

(104)

(102)

(105)

(103)

(106)

MICROCHANNEL-ELEMENT ASSEMBLY AND PREPARATION METHOD THEREOF

FIELD OF THE INVENTION

The present invention relates to a microchannel-element assembly and its preparation method, especially to an integrated assembly of a microchannel and an element and the preparation method of the assembly.

BACKGROUND OF THE INVENTION

A microchannel is a channel prepared in a silicon dice, allowing a fluid to flow through. Among the preparation methods of the microchannel, an approach using a polysilicon sacrificial layer to define a microchannel was invented by Industrial Microelectronic Center (IMC) of Sweden, in 1997. According to this approach, a polysilicon sacrificial layer is prepared on a silicon substrate to define an area to be etched off. A low-stress silicon nitride (SiNx) layer is then formed on the sacrificial layer with the LPCVD (low-pressure chemical vapor deposition) technology. The silicon nitride layer is then etched with the RIE (reactive-ion etching) technology to produce a number of cavities in predetermined positions thereof. Thereafter, the assembly is etched in a KOH etchant such that the sacrificial layer is etched off. Then an area of the silicon substrate beneath the sacrificial layer is etched off to form a V-shape groove inside the silicon substrate. Finally the assembly is planarized by coating the upper surface of the SiNx layer with a silicon dioxide ($SiO_2$) layer. A microchannel is thus prepared. IMC used this technology to produce flip chips for use in optical fiber passive alignment and in laser diodes.

A closed microchannel may also be prepared by bonding (positive pole bonding or by diffusion bonding) a glass substrate to a silicon substrate with a V-shape groove, or two silicon substrates both with a V-shape groove. If an element shall be prepared inside the microchannel, the sensor is formed on the planarization $SiO_2$ layer, right up the V-shape groove. After the V-shape groove is prepared, the substrate containing such V-shape groove is bonded to another substrate to have a closed microchannel containing an element. This technology was disclosed by Honda in U.S. Pat. No. 5,620,929.

As described above, in the conventional art, the lower portions of the microchannel is prepared by etching the silicon substrate with an etchant from all directions. During the etching process, an area is reserved to deposit the sensor. When an open channel is prepared, the sensor is positioned on the reserved area. The assembly so prepared is then bonded with a glass substrate or another silicon substrate to have a closed microchannel. During the bonding process, pollution will be created and errors will be made. These and other factors are major reasons of decreased yield rate and high manufacture costs.

It is thus a need in the industry to have a new method to prepare a microchannel provided with an element whereby no bonding is needed in the preparation process.

It is also needed to have a method for the preparation of microchannel-sensor assembly where a microchannel and an element may be prepared in one process.

It is also needed to have a method for the preparation of microchannel-element assembly where planarization may be accomplished during the preparation of the assembly.

OBJECTIVES OF THE INVENTION

The purpose of this invention is to provide a novel method for the preparation of a microchannel-element assembly wherein no bonding process is required.

Another purpose of this invention is to provide a method for the preparation of a microchannel-element assembly wherein a microchannel and a sensor are integrated in one single dice.

Another purpose of this invention is to provide a method for the preparation of microchannel-sensor assembly where a microchannel and an element may be prepared in one process.

Another purpose of this invention is to provide a method for the preparation of a microchannel-element assembly that is compatible to the conventional IC manufacture process.

Another purpose of this invention is to provide a method for the preparation of a microchannel-element assembly wherein planarization of the assembly may be accomplished during the preparation process.

Another purpose of this invention is to provide a microchannel-element assembly prepared according to the above methods.

SUMMARY OF THE INVENTION

According to this invention, a novel preparation method for a microchannel-element assembly is disclosed. In the preparation method of this invention, an element is prepared between a substrate and a sacrificial layer. Two protection layers, which are resistant to etchant for said substrate and said sacrificial layer, are prepared to isolate said element from its ambient environment. Said sacrificial layer defines an area to be etched off such that a microchannel may be formed. A coating layer with etching windows is then prepared on said sacrificial layer and the assembly is etched in an etchant to etch off said sacrificial layer and an area of said substrate beneath said sacrificial layer. An integrated assembly of a closed microchannel and an element is then accomplished. In the invented method, no bonding process is necessary and the integrated assembly so prepared has a planarization surface. This invention also disclosed a microchannel-element assembly prepared under the method of this invention.

The above and other objectives and advantages of this invention may be clearly understood from the detailed description by referring to the following drawings.

IN THE DRAWINGS

FIG. 1–(101) FIG. 1–(102) FIG. 1–(103) FIG. 1–(104) FIG. 1–(105) and FIG. 1–(106) illustrate the flow chart of one embodiment of the preparation method of microchannel-element assembly of this invention.

FIG. 2 illustrates the structure of an embodiment of the microchannel-element assembly of this invention.

DETAILED DESCRIPTION OF THE INVENTION

In the preparation method of microchannel-element assembly of this invention, the element is protected by two etchant-resistant layers during the preparation of the microchannel. The microchannel is prepared with the anisotropic etching technology. As the element is isolated from the ambient environment, the heat effects of the etching system may not affect the performance of the element. An integrated assembly of a closed microchannel and an element may be prepared at the same time; No further bonding process is required. The assembly so prepared has a substantially planar surface; No further planarization process is required. As the microchannel and the element may be integrated in one single dice, the after-processing of the dice will be the same as that in the semiconductor manufacture process.

Figure 1:
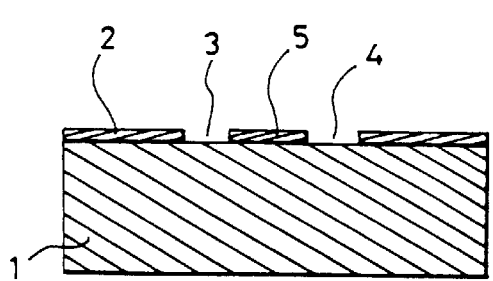
Figure 1:
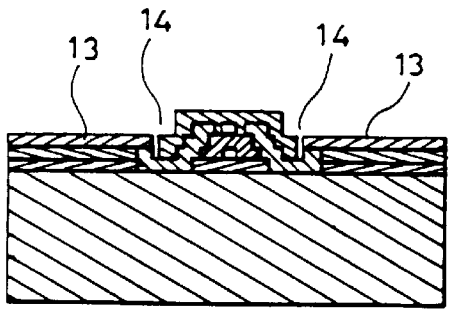
Figure 1:
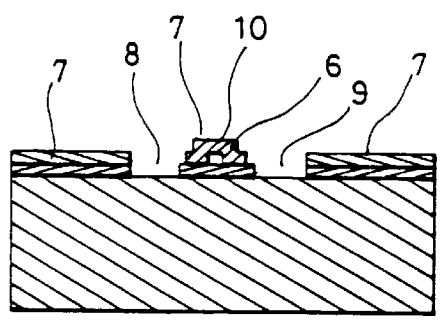
Figure 1:
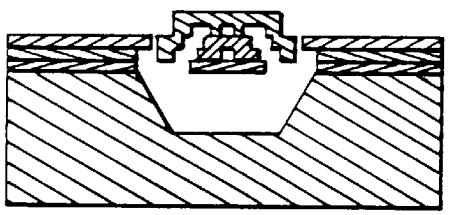
Figure 1:
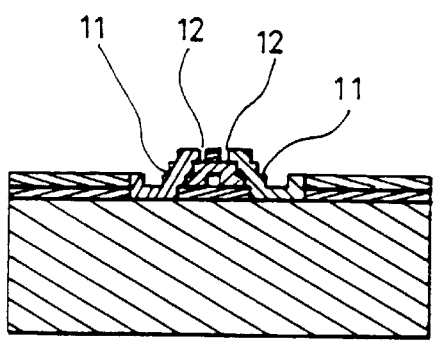
Figure 1:
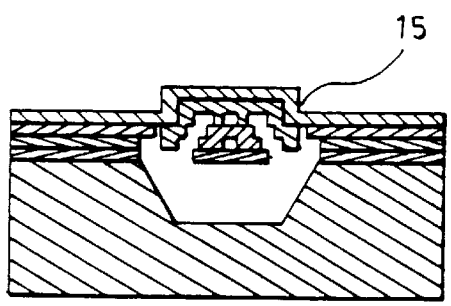
Figure 2:
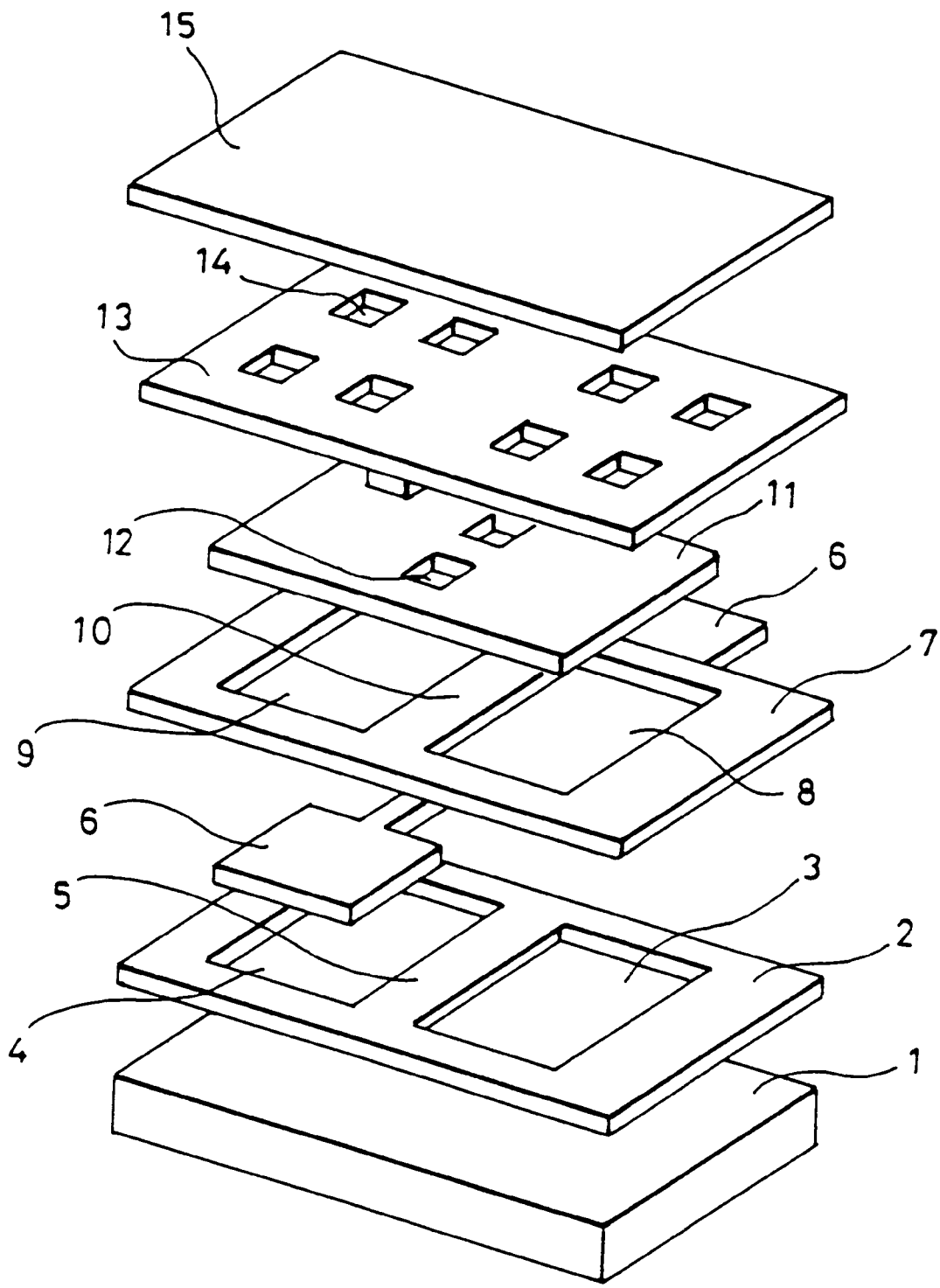

The following is a detailed description of an embodiment of the present invention. FIG. 1 illustrates the flow chart of one embodiment of the preparation method of microchannel-element assembly of this invention. FIG. 2 illustrates the structure of a microchannel-element assembly so prepared.

As shown in FIG. 1, preparation of a microchannel-element assembly of this invention includes the following steps:

First, at 101, a (100) silicon substrate 1 is prepared and a first silicon nitride (SiNx) layer 2 is formed on said substrate 1. Later, the first SiNx layer 2 is etched to obtain windows 3 and 4. An area of said first silicon nitride layer functions as a first protection layer 5 in the following steps. The product prepared in this stage is shown in 101 of FIG. 1.

Later at 102, a thermal sensitive resistor (or a thermal membrane) 6 is plated on the first protection layer 5, to function as a sensor (or a heater). Here, the dimension of the sensor 6 at the area corresponding to the first protection layer 5 is preferably smaller than that of the first protection layer 5. A second silicon nitride layer 7 is then formed on the first silicon nitride layer 2 and sensor 6. The second silicon nitride layer 7 is then etched to obtain windows 8 and 9. An area of said second silicon nitride layer functions as a second protection layer 10 in the following steps. The product so prepared is shown in 102 of FIG. 1. Here, again, the dimension of the sensor 6 at the area corresponding to the second protection layer 10 is preferably smaller than that of the second protection layer 10. The second protection layer 10 and the first protection layer 2 thus securely isolate sensor 6 from its ambient environment.

At 103, a sacrificial layer 11 is formed on the second protection layer 10 and seals windows 8 and 9 (and 3 and 4). The sacrificial layer 11 is then etched in an etchant to form a window 12 at the area above the second protection layer 10. The product prepared in this stage is shown in 103 of FIG. 1. Later at 104, a third silicon nitride layer 13 is formed on the sacrificial layer 1 1. The third silicon nitride layer 13 is then etched in an etchant to obtain windows 14, 14. Windows 14 locate above windows 8 and 9 (and windows 3 and 4). The product prepared in this stage is shown in 104 of FIG. 1.

At 105, the assembly so prepared is put in an etchant to etch off the sacrificial layer 11. An anisotropic etchant is then used to etch the substrate 1 to form a V-shape groove at the area beneath the sacrificial layer 11. The product so prepared is shown in 105 of FIG. 1. Finally, at 106, a third protection layer 15 is prepared on the third silicon nitride layer 13 to seal windows 14, 14, to accomplish the planarization. The product so prepared is shown in 106 of FIG. 1.

The structure of the microchannel-sensor assembly so prepared is shown in FIG. 2. In this figure, 1 represents the substrate, 2 represents the first silicon nitride layer, 3 and 4 are windows, 5 represents the first protection layer, 6 represents the element, 7 represents the second silicon nitride layer, 8 and 9 are windows, 10 represents the second protection layer, 11 represents the sacrificial layer, 12 is a window, 13 represents the third silicon nitride layer, 14 is a window and 15 represents the third protection layer.

Effects of the Invention

As described above, during the preparation of the microchannel the element is isolated from the peripheral components so that the heat effects of the ambient environment will not affect the character of the element. While the element is protected during the etching process, an integrated assembly of a closed microchannel and an element may be prepared in the same process. Since the microchannel so prepared is not an open channel, no bonding process is required. The assembly so prepared has a substantially planar surface; No further planarization process will be necessary. As the microchannel and the element are integrated in one single dice, the after-processing of the dice will be compatible to that of the semiconductor manufacture process.

Although in the description of the embodiment of the invention, material of the protection layers is SiNx, other suited materials may be used to form the protection layer. It is also possible to use a high molecular material to prepare the substrate and the first protection layer in one single step. In the above embodiment, KOH is used as the etchant. Other etchants, however, may be applied to this invention, as long as similar effects are obtained. In some other embodiments, non-chemical etching is adopted.

In the detailed description, a thermal sensitive resistor and a heat-generating membrane are given as examples of the element to be prepared. Other elements suited in the process as described may be applicable to this invention as well.

As the present invention has been shown and described with reference to preferred embodiments thereof, those skilled in the art will recognize that the above and other changes may be made therein without departing from the spirit and scope of the invention.

What is claimed is:

1. A method for the preparation of an assembly of a microchannel and an element, comprising the following steps in sequential order;

prepare a substrate;

form a first etching resistant layer on said substrate wherein said first etching resistant layer comprises at least one etching window;

form an element on said first etching resistant layer at an area other than said at least one etching window;

form a second etching resistant layer on said first etching resistant layer and said sensing element, thus said sensing element is insulated securely by said first and said second etching resistant layers; wherein said second etching resistant layer comprises at least one etching window substantially with same dimension and at same position(s) as said at least one etching window in said first etching resistant layer;

form a sacrificial layer on said second etching resistant layer;

form a third etching resistant layer on said sacrificial layer wherein said third etching resistant layer comprises a number of cavities at positions corresponding to said at least one etching window of said second etching resistant layer;

etch the product so prepared in an etchant; and form a coating layer on said third etching resistant layer.

2. The method according to claim 1 wherein said element comprises a sensing element.

3. The method according to claim 1 wherein said element comprises a heat-generating element.

4. The method according to claim 1, 2 or 3 wherein said etching resistant layer comprises a thermal conductive and etching resistant material.

5. The method according to claim 4 wherein said etching resistant layer is a silicon nitride layer.

* * * * *